United States Patent
Kaya et al.

(10) Patent No.: US 8,013,677 B2
(45) Date of Patent: Sep. 6, 2011

(54) ONE-SIDED SWITCHING PULSE WIDTH MODULATION AMPLIFIERS

(75) Inventors: Cetin Kaya, Plano, TX (US); Richard K. Hester, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 12/639,712

(22) Filed: Dec. 16, 2009

(65) Prior Publication Data

US 2011/0140774 A1    Jun. 16, 2011

(51) Int. Cl.
*H03F 3/217* (2006.01)
(52) U.S. Cl. ...................................... 330/207 A; 330/10
(58) Field of Classification Search ......... 330/10.207 A, 330/251
See application file for complete search history.

(56) References Cited

U.S. PATENT DOCUMENTS

| | | |
|---|---|---|
| 7,339,425 B2 | 3/2008 | Yang |
| 7,733,170 B2 * | 6/2010 | Cheng ............................ 330/10 |
| 2003/0122615 A1 | 7/2003 | Zeff |

* cited by examiner

*Primary Examiner* — Robert Pascal
*Assistant Examiner* — Khiem Nguyen
(74) *Attorney, Agent, or Firm* — John J. Patti; Wade J. Brady, III; Frederick J. Telecky, Jr.

(57) ABSTRACT

One-sided pulse width modulated (PWM) amplifiers are disclosed. An example amplifier includes an integrator to receive first and second analog signals, and to output a first amplified signal and a second amplified signal based on the first and second analog signals, a reference changer coupled to the integrator to determine whether a first amplitude is higher than a second amplitude based on the first and second analog signals, to selectively cause the integrator to apply a first resistance between a reference node and the first amplified signal and apply a second resistance between the reference node and the second amplified signal when the first amplitude is higher than the second amplitude, and to selectively cause the integrator to apply the second resistance between the reference node and the first amplified signal and apply the first resistance between the reference node and the second amplified signal when the second amplitude is higher than the first amplitude, and first and second comparators coupled to the integrator to receive the first and second amplified signals, to compare the first and second amplified signals to a reference signal, and to output first and second pulse width modulated signals having respective first and second pulse widths based on the comparisons between the first and second amplified signals and the reference signal.

26 Claims, 11 Drawing Sheets

ONE-SIDED SWITCHING PULSE WIDTH MODULATION AMPLIFIERS

FIELD OF THE DISCLOSURE

This disclosure relates generally to pulse width modulated amplifiers and, more particularly, to one-sided switching pulse width modulated amplifiers.

BACKGROUND

A class-D, or switching, amplifier is a high-efficiency amplifier often used to amplify an audio signal. In a system using a class-D amplifier, an analog input signal is transformed into a series of pulses having different pulse widths (i.e., a pulse width modulated signal). The class-D amplifier amplifies the pulse width modulated signal to, for example, drive an audio speaker. The high efficiency of a class-D amplifier is partly realized from low quiescent current generated when the input signal to the amplifier is idle and partly realized from lower resistances of the output transistors when the transistors are conducting. The input signal is often idle when typical audio signals are input to the amplifier, because many audio signals include significant amounts of idle time. A class-D amplifier operates in a switching mode, which reduces or eliminates quiescent currents as compared to an active-resistance transistor operation used in class-AB amplifiers. Reduced quiescent current, in turn, reduces overall power consumption of the class-D amplifier over that of the class-AB amplifier.

SUMMARY

In some described examples, a pulse width modulated (PWM) amplifier includes an integrator to receive first and second analog signals, and to output a first amplified signal and a second amplified signal based on the first and second analog signals, a reference changer coupled to the integrator to determine whether a first amplitude is higher than a second amplitude based on the first and second analog signals, to selectively cause the integrator to apply a first resistance between a reference node and the first amplified signal and apply a second resistance between the reference node and the second amplified signal when the first amplitude is higher than the second amplitude, and to selectively cause the integrator to apply the second resistance between the reference node and the first amplified signal and apply the first resistance between the reference node and the second amplified signal when the second amplitude is higher than the first amplitude, and first and second comparators coupled to the integrator to receive the first and second amplified signals, to compare the first and second amplified signals to a reference signal, and to output first and second pulse width modulated signals having respective first and second pulse widths based on the comparisons between the first and second amplified signals and the reference signal.

Some example PWM amplifiers described herein further include a common mode controller to receive first and second analog signals, a common mode reference having a reference amplitude higher than a lower amplitude of a reference signal, and a common mode signal. The example common mode controllers generate a first amplified signal having a first amplitude and a second amplified signal having a second amplitude based on the first and second analog signals and the common mode signal, where the first and second amplitudes are substantially equal to the reference amplitude when the first and second analog signals are idle.

In some examples, the PWM amplifiers further include first and second comparators coupled to the integrator to receive the first and second amplified signals, to compare the first and second amplified signals to a reference signal, and to output first and second pulse width modulated signals having respective first and second pulse widths based on the comparisons between the first and second amplified signals and the reference signal. The PWM amplifiers may further include an output stage coupled to the first and second comparators, which includes first and second portions to selectively drive a load, wherein the first portion is responsive to the first pulse width modulated signal and the second portion is responsive to the second pulse width modulated signal.

DETAILED DESCRIPTION

Figure 1:
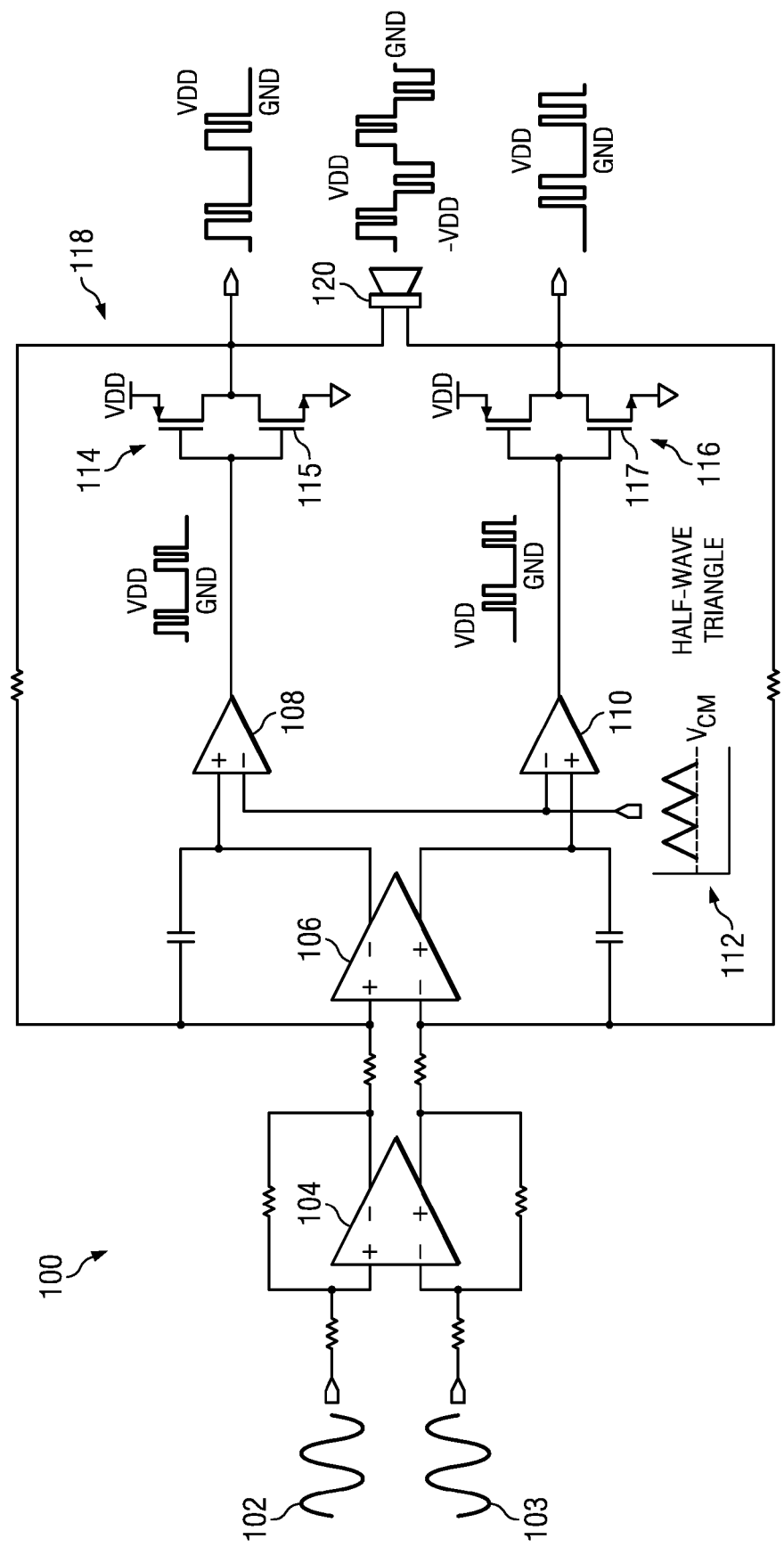
FIG. 1 illustrates a conventional pulse width modulation amplifier using a half-swing modulation scheme.

Certain examples are shown in the above-identified figures and described in detail below. In describing these examples, like or identical reference numbers will be used to identify common or similar elements. Although the following discloses example methods and apparatus, it should be noted that such methods and apparatus are merely illustrative and should not be considered as limiting. The example circuits described herein may be implemented using any suitable technique or technology, such as discrete components, integrated circuits (ICs), or any combination thereof Accordingly, while the following describes example circuits, apparatus, and methods, persons of ordinary skill in the art will readily appreciate that the examples are not the only way to implement such methods and apparatus.

The example one-sided switching pulse width modulation amplifiers described herein may be used to provide amplifiers that use less power and have improved total harmonic distortion over prior amplifier techniques or topologies. The example amplifiers described below may be particularly useful in amplifying audio signals for delivery to a speaker, but are likewise useful for other applications.

In some examples, a pulse width modulated amplifier includes an integrator to receive first and second analog signals and to output first and second amplified signals that are based on the analog signals. Some example amplifiers also include a reference changer that is coupled to the integrator. The reference changer determines whether a first amplitude is higher than a second amplitude based on the first and second analog signals. In some examples, the first and second amplitudes are based on the first and second amplified signals, respectively. Some example reference changers selectively cause the integrator to apply a first resistance between a reference node and the first amplified signal and apply a second resistance between the reference node and the second amplified signal when the first amplitude is higher than the second amplitude. Some example reference changers selectively cause the integrator to apply the second resistance between a reference node and the first amplified signal and apply the first resistance between the reference node and the second amplified signal when the second amplitude is higher than the first amplitude.

Some example reference changers change the first and second resistances to cause the first amplified signal to change at a greater rate than the second amplified signal when the first amplitude is higher than the second amplitude, and cause the second amplified signal to change at a greater rate than the first amplified signal when the second amplitude is higher than the first amplitude. In some examples, the reference changer includes a comparator to receive the amplified signals and determine whether the first amplitude is higher than the second amplitude, and a resistor network coupled to the comparator and coupled between the first and second amplified signals, where the first and second resistances are based on the resistor network. Some example reference changers also include a switching network coupled to the comparator, where the comparator causes the switching network to selectively couple the common mode signal to a first node in the resistor network or a second node in the resistor network based on which of the first or second amplitudes is higher.

Some example amplifiers include first and second comparators coupled to the integrator. The example first and second comparators receive the first and second amplified signals, respectively, and compare the amplified signals to a reference signal. In some examples, the reference signal is a half-swing modulation signal. Based on the comparisons between the amplified signals and the reference signal, some example first and second comparators output first and second pulse width modulated signals having respective first and second pulse widths. In some examples, the first pulse width increases to 100% or decreases to 0% when the second amplitude is greater than the first amplitude. In some examples, the first and second pulse widths are between 5% and 15%, or between 85% and 95%, when the first and second analog signals are idle.

In some examples, the integrator includes a common mode controller to receive the first and second analog signals, a common mode reference having a reference amplitude higher than a lower amplitude of the reference signal, and a common mode signal. The example integrators generate the first and second amplified signals based on the first and second analog signal and the common mode signal. In some examples, the first and second amplitudes are substantially equal to the reference amplitude when the analog signals are idle. In some examples, the first resistance is based on a first resistor network resistance between the first amplified signal and the common mode signal and the second resistance is based on a second resistor network resistance between the second amplified signal and the common mode signal. In some examples, a ratio of the first resistance to the second resistance is 4:1. In some other examples, the ratio of the first resistance to the second resistance may range between 1000:1 and 1:1.

In some examples, the switching network includes a first switching element to selectively couple the common mode signal to a first node in the resistor network when the first amplitude is higher than the second amplitude, where the first resistance is between the first node and the first amplified signal, and the first resistance is greater than the second resistance between the first node and the second amplified signal. The example switching networks also include a second switching element to selectively couple the common mode signal to a second node in the resistor network when the second amplitude is higher than the first amplitude, where a third resistance is between the second node and the first amplified signal, and the first resistance is less than a fourth resistance between the first node and the second amplified signal.

As used herein and unless otherwise qualified, an "increasing" signal refers to an increase in an amplitude of the signal. Similarly, a "decreasing" signal refers to a decrease in the amplitude of the signal. Additionally, when a first referenced signal "is higher than" or "is greater than" a second referenced signal, the amplitude of the first referenced signal is higher or greater than the amplitude of the second referenced signal. Similarly, when the first referenced signal "is less than" or "is lower than" a second referenced signal, the amplitude of the first referenced signal is less than or lower than the amplitude of the second referenced signal.

FIG. 1 illustrates a conventional PWM amplifier 100 with a half-swing modulation scheme. The amplifier 100 receives a differential input signal 102 and 103 into a differential amplifier 104. The differential amplifier 104 amplifies the differential input signals 102 and 103 and provides them to an integrating amplifier (e.g., an integrator) 106. The integrator 106 integrates and amplifies with input signals and provides output signals to respective comparators 108 and 110.

Figure 2:
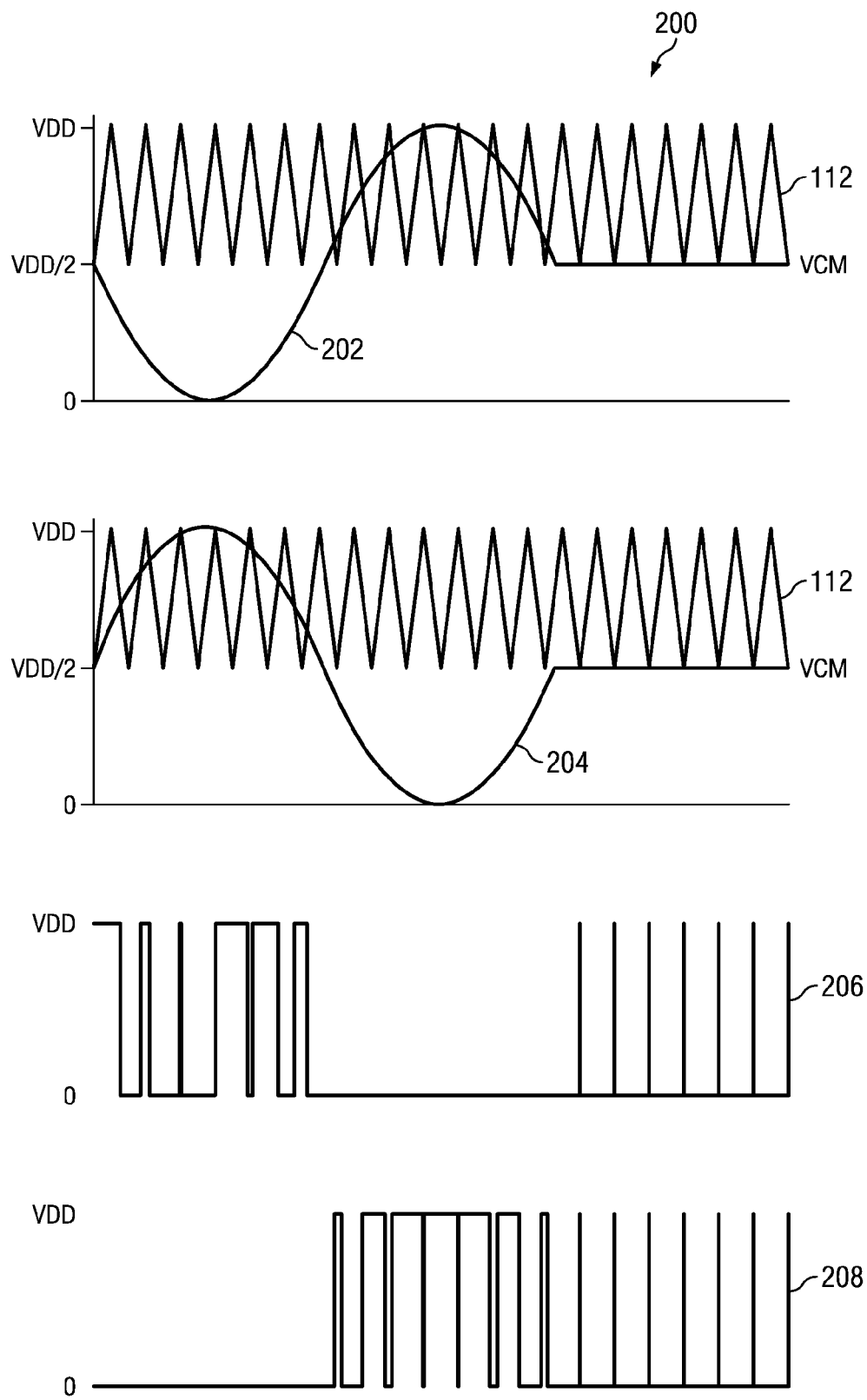
FIG. 2 illustrates signals associated with a conventional half-swing modulation scheme.

The comparators 108 and 110 receive the integrated signals and compare the integrated signals to a half-swing triangle modulation signal 112. FIG. 2 illustrates signals associated with a conventional half-swing modulation scheme 200. In contrast to a conventional full-wave modulation signal that traverses the amplifier voltage range of VDD to GND, the half-swing triangle modulation signal 112 is limited to the upper half of the amplifier voltage range, or VDD to VDD/2. Two integrated signals 202 and 204 have a common mode voltage VCM, which is the midpoint voltage between the signals 202 and 204. Because the signals increase and decrease, respectively, equally from a constant amplitude, the common mode voltage VCM of the signals 202 and 204 is constant. As a result, when the integrated signal 202 (represented by a sine wave in FIG. 2) input to the comparator 108 is below the common mode voltage VCM (e.g., VDD/2), an output 206 of the comparator 108 is constant at logic low (e.g., GND). Similarly, when the integrated signal 204 input to the comparator 110 is below the common mode voltage VCM, an output 208 of the comparator 110 is constant at logic low.

The comparator 108 of FIG. 1 compares the modulation signal 112 to the integrated signal 204 and the comparator 110 compares the modulation signal 112 to the integrated signal 202. Generally, the output 208 of the comparator 110 switches due to the comparison between the integrated signal 204 and the modulation signal 112 while the output 206 of the comparator 108 remains constant. Similarly, the output 206 of the comparator 108 switches due to the comparison between the integrated signal 202 and the modulation signal 112 while the output 208 of the comparator 110 remains constant. As a result, when the modulation signal 112 has a higher amplitude than the integrated signal 202, the output 206 of the comparator 108 is at logic high. A series of pulses is generated at the output 206 when the modulation signal 112 repeatedly increases above and decreases below the integrated signal 202. A similar series of pulses is generated at the output 208 when the modulation signal 112 repeatedly increases above and decreases below the integrated signal 204.

Returning to FIG. 1, the outputs (e.g., PWM signals) from the comparators 108 and 110 are input to respective portions 114 and 116 of an H-bridge 118. The H-bridge 118 drives a load, such as an audio speaker 120, by switching the portions 114 and 116 to conduct current through the load in response to the PWM output pulses from the comparators 108 and 110. Due to the half-wave modulation signal, only one of the H-bridge portions 114 or 116 switches at a time, while the other is held constant at VDD or GND.

The conventional amplifier 100 of FIG. 1 may suffer from distortion problems when the input signal is idle and/or at a signal zero-crossing (i.e., both integrated signals 202 and 204 have an amplitude equal to VCM). When the input signals are idle or at a zero crossing, the integrated signals 202 and 204 settle at VCM, which is at the bottom of the amplitude range of the modulation signal 112. As illustrated in FIG. 2, very short pulses occur on the output signals 206 and 208 due to, for example, noise on the modulator signal 112 and/or the integrated signals 202 and 204. The output transistors of the H-bridge 118, and especially low side FETs 115 and 117, cannot keep up with such short pulses. As a result, distortion may occur when the modulation signal 112 and the integrated signals 202 and 204 are compared at the respective comparators 108 and 110, because the comparators 108 and/or 110 may output very small pulses where no pulse is expected.

Figure 3:
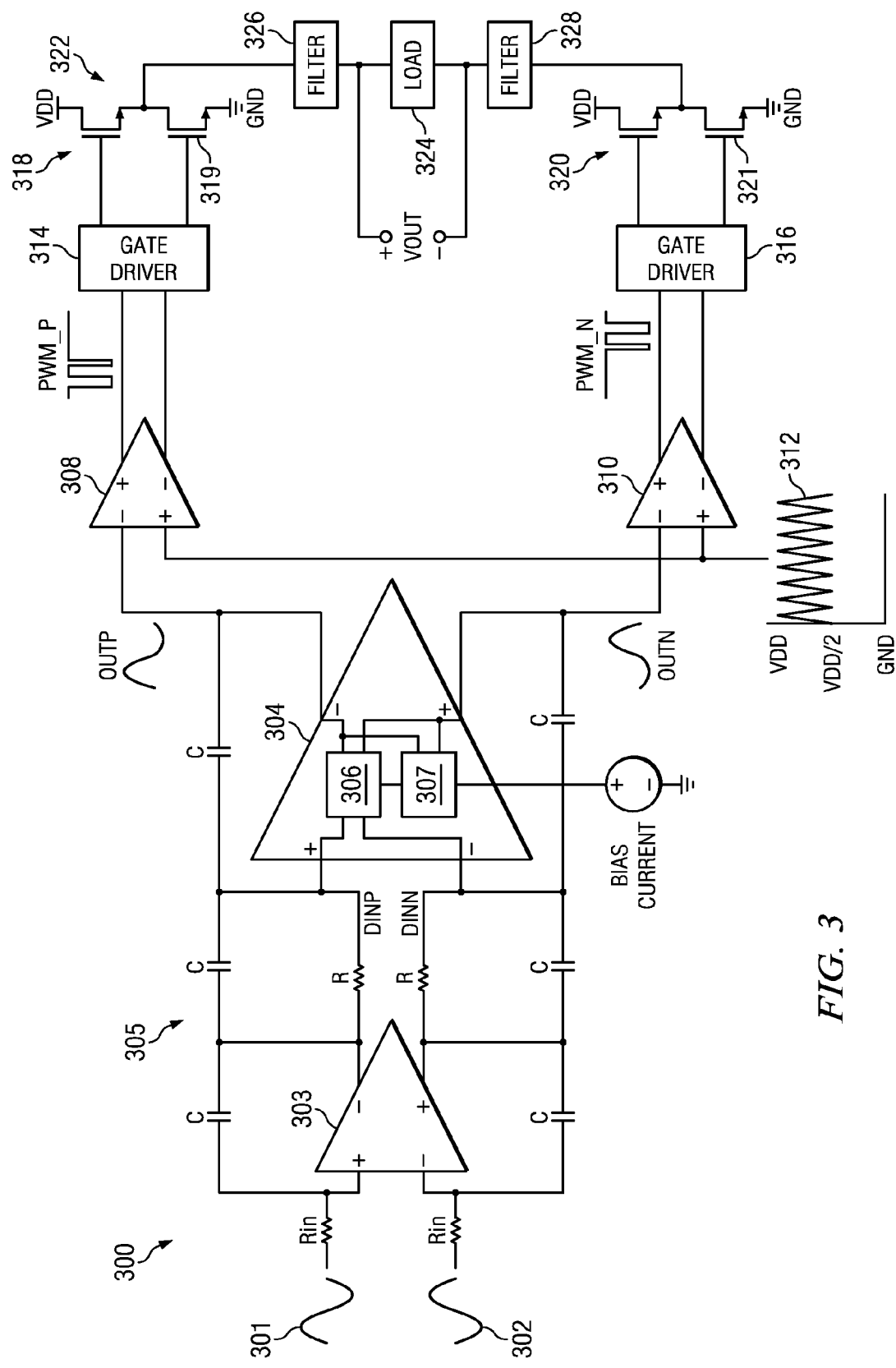
FIG. 3 is a schematic view of an example one-sided switching pulse width modulation amplifier including a reference changer and a common mode controller.

FIG. 3 is a schematic view of an example one-sided switching PWM amplifier 300. The example amplifier 300 has reduced power consumption and/or lower total harmonic distortion (THD) compared to conventional class-D and class-BD switching amplifiers. The reduced power consumption of the example amplifier 300 results from reduced transistor switching, as described in more detail below. In operation, the example amplifier 300 receives input analog signals 301 and 302, generates high and low side signals OUTP and OUTN based on the analog signals 301 and 302, generates high and low series of pulses PWM_P and PWM_N representative of the high and low signals OUTP and OUTN, and generates an output signal VOUT based on the high and low pulses PWM_P and PWM_N. In contrast to the conventional signals 202 and 204 generated by the integrator 106 of FIG. 1, the example signals OUTP and OUTN are generated by applying different weights based on the input analog signals 301 and 302. In the illustrated example of FIG. 3, the input analog signals 301 and 302 are differential signals. However, the example amplifier 300 may be modified to use single-ended analog or even digital input signals. For example, a digital-to-analog converter may be coupled to the amplifier 300 at the input to generate the input analog signals 301 and 302 based on digital input signals.

As illustrated in FIG. 3, a first integrator 303 is an amplifier configured as an integrator and receives differential inputs 301 and 302 via equal or substantially equal input resistors Rin. The first integrator 303 sets the bandwidth of the PWM amplifier 300 in a conventional manner and outputs analog signals DINP and DINN, which are amplified and integrated versions of the input signals 301 and 302. As is known, an integrator applies a phase shift to a sine wave, so DINP and DINN may also be phase-shifted from the input signals 301 and 302. The analog signals DINP and DINN are then input to a second amplifier 304 that is also configured as an integrator. In the example of FIG. 3, the first 303 and second integrators 304 are coupled by an RC network 305. The first and second integrators 303 and 304 include common mode controllers 306, which are described in more detail below. However, the second integrator 304 differs from the first integrator 303 in that the second integrator 304 includes a reference changer 307.

The example common mode controller 306 in the second integrator 304 receives first and second analog signals (e.g., DINP and DINN), a common mode reference VCM, and a common mode signal V_COM. The common mode controller 306 generates first and second amplified signals OUTP and OUTN having respective first and second amplitudes that are based on the first and second analog signals DINP and DINN and the common mode signal. OUTP and OUTN may also be phase-shifted from the signals DINP and DINN due to the effects of the integrator 304. In particular, as explained below, the amplified signals OUTP and OUTN are not symmetrical with respect to a constant common mode reference signal (VCM). As used herein, symmetrical refers to a relationship shared by two signals (e.g., OUTP and OUTN) that increase in amplitude at equal and opposite rates (e.g., +x Volts (V)/second (sec) and −x V/sec). Additionally or alternatively, symmetrical may refer to a relationship shared by two signals (e.g., analog signals DINP and DINN) that have a constant common mode amplitude (e.g., VCM). For example, the input signals 301 and 302, the analog signals DINP and DINN, and the conventional signals 202 and 204 are symmetrical signals. In contrast, the amplified signals OUTP and OUTN are not symmetrical. The asymmetry is illustrated by the absolute values of the change rates of OUTP and OUTN, which are different. Additionally, the common mode of the amplified signals (e.g., (OUTP+OUTN)/2) changes instead of remaining constant.

The example reference changer 307 is coupled to the common mode controller 306 to cause the common mode controller 306 to generate the first amplified signal OUTP and the second amplified signal OUTN based on the relative amplitudes of DINP and DINN. In particular, the reference changer 307 adjusts a reference node based on a comparison of the amplitudes of either the analog signals DINP and DINN or the amplified signals OUTP and OUTN. By adjusting the reference node, the amplified signals OUTP and OUTN increase and decrease in amplitude differently. The example reference changer 307 and the example common mode controller 306 are described in more detail below in the examples of FIGS. 5-11.

When the second integrator 304 receives the analog signals DINP and DINN from the first integrator 303, the analog signals DINP and DINN may have substantially constant peak-to-peak magnitudes. The example reference changer 307 couples a first reference node or a second reference node to a substantially constant amplitude, based on which of the amplified signals OUTP or OUTN has a higher amplitude. The first and second reference nodes have different resistance ratios between the amplified signals OUTP and OUTN. For example, the reference changer 307 may couple the reference node to a first node such that a first resistance between the reference node and the first amplified signal OUTP is higher than a second resistance between the reference node and the second amplified signal OUTN when the first amplified signal OUTP has a higher amplitude than a common mode amplitude (i.e., the midpoint amplitude between the first and second amplified signals OUTP and OUTN) and the amplitude of the second amplified signal OUTN is lower than the common mode amplitude (i.e., the amplitude of the first amplified signal OUTP is higher than the amplitude of the second amplified signal OUTN). As a result, the common mode amplitude changes as the first (or second) differential signal increases at a greater rate than the second (or first) differential signal decreases. The integrator 304 then outputs first and second amplified signals OUTP and OUTN representative of the gains applied to the first and second analog signals DINP and DINN.

The example amplifier 300 further includes high and low comparators 308 and 310, which receive respective ones of the first and second amplified signals OUTP and OUTN. In the illustrated example, the comparators 308 and 310 receive the amplified signals OUTP and OUTN at the respective inverting inputs. The comparators 308 and 310 also receive at the non-inverting inputs a modulation (or reference) signal 312 to modulate the amplified signals OUTP and OUTN into PWM signals PWM_P and PWM_N. The example modulation signal 312 is a triangle wave, but could alternatively be a sawtooth wave or another appropriate modulation waveform. The modulation signal 312 typically has a much greater frequency than the highest frequency of interest in the amplified signals OUTP and OUTN. For example, for audio-frequency signals, the modulation signal 312 may have a 300 kilohertz (kHz) or a 2.4 megahertz (MHz) frequency. The example half-swing modulation signal 312 of FIG. 3 is limited to a voltage range of VDD to VDD/2.

The comparators 308 and 310 compare the amplified signals OUTP and OUTN to the modulation signal 312, and output high and low PWM signals PWM_P and PWM_N. For example, while the amplified signal OUTP has a higher amplitude than the amplified signal 406 OUTN, the PWM signal PWM_P is generated by the comparator 308 as a series of pulses. As the amplitude of the amplified signal OUTP increases, the pulse width of PWM_P increases. Meanwhile, the comparator 310 compares the amplified signal OUTN to the modulation signal 312, and outputs the PWM signal PWM_N. For at least a portion of the time that the amplified signal OUTN is in the negative half-swing (i.e., lower than OUTP), the amplified signal OUTN decreases below the amplitude range of the modulation signal 312, causing the comparator 310 to output PWM_N at a constant logic high for at least that portion of time.

Gate drivers 314 and 316 receive the respective ones of the PWM signals PWM_P and PWM_N and drive respective portions 318 and 320 of an output stage 322 (e.g., an H-bridge). Each portion 318 and 320 of the example H-bridge 322 includes two n-channel field effect transistors (NFETs). The NFETs may be switched on to control the output of the respective portion 318 or 320 to generate a logic high signal or a logic low signal. Thus, the H-bridge 322 produces the differential pulse width modulated output signal VOUT to drive a load 324. The gate drivers 314 and 316 may be implemented in a known manner to drive low and high side NFETs.

The load 324 may be, for example, an audio speaker. The output signal VOUT is further filtered using filters 326 and 328 before being output to the load 324. The filters 326 and 328 smooth the output signal VOUT pulses into a sine-based waveform. In some other examples, the filters 326 and 328 may be omitted and VOUT may be output to the load 324 as a PWM signal.

FIG. 4 illustrates a set of waveforms 400 generated by the one-sided switching pulse width modulation amplifier 300 of FIG. 3. The example set of waveforms 400 will be used to describe the operation of the example one-sided switching PWM amplifier 300. The waveforms 400 include examples of the input signals 301 and 302, the analog signals DINP and DINN, the half-swing triangular modulation signal 312, the high side amplified signal OUTP, a low side amplified signal OUTN, a common mode signal 402, PWM signals PWM_P and PWM_N, and a PWM output signal 404.

The input signals 301 and 302 are input to the first integrator 303 of FIG. 3. In the example case where the input signals 301 and 302 are audio signals, the input signals are sine waves of one or more changing frequencies. The first integrator 303 receives the input signals 301 and 302 and integrates the signals 301 and 302 in a conventional manner to generate analog signals DINP and DINN.

The analog signals DINP and DINN are responsive to the input signals 301 and 302. The first integrator 303 may cause amplification and/or phase shifting from the input signals 301 and 302 to generate the analog signals DINP and DINN. As illustrated in FIG. 4, when the input signal 301 increases and the input signal 302 decreases, DINP decreases and DINN increases accordingly. Similarly, when the input signal 301 decreases and the input signal 302 increases, DINP increases and DINN decreases. Additionally, when the input signals 301 and 302 are idle (i.e., equal to the DC level DC1), the analog signals DINP and DINN are similarly idle (i.e., equal to the DC level DC2). The first integrator 303 may apply a gain (i.e., amplification) or a DC offset such that DINP and DINN have different magnitudes and/or DC offset(s) than the input signals 301 and 302, respectively.

The amplified signals OUTP and OUTN are responsive to the analog signals DINP and DINN via the integrator 304. The integrator 304 receives the analog signals DINP and DINN and outputs the amplified signals OUTP and OUTN based on comparing the amplitudes of OUTP and OUTN and applying different resistances (e.g., 0.8 X and 0.2 X) between the respective amplified signals OUTP and OUTN and a reference node based on the comparison. For example, when DINN is greater than DINP, a greater first resistance (e.g., 0.8 X) is applied between OUTP and the reference node than the second resistance (e.g., 0.2 X) applied between the reference node and OUTN. Conversely, when DINN is lesser than DINP, the second resistance is greater (e.g., 0.8 X) between the reference node and OUTN than the first resistance (e.g., 0.2 X) between the reference node and OUTP. The term X may be any resistance value and may be set within the limits of the application (e.g., such that VDD>(OUTP and/or OUTN)>GND) to avoid or obtain a clipped signal. For example, X may be large (e.g., >150 kΩ) to avoid significant loading between the amplified signals OUTP and OUTN by the first and second resistances. In the example of FIG. 4, the resistances applied to generate OUTP and OUTN are fixed at 0.8 X and 0.2 X, but the resistances may be fixed at any other ratio between 1000:1 and 1:1 or may be adjustable.

For clarity, the input signals 301 and 302, the analog signals DINP and DINN, and the amplified signals OUTP and OUTN are shown in FIG. 4 to be in phase to show the causal relationships. However, the signals 301 and 302, DINP and DINN, and OUTP and OUTN may have a different phase relationship without departing from the scope of this disclosure. Additionally, the example input signals 301 and 302 and the example analog signals DINP and DINN are differential signals. Accordingly, the DC values of the signals 301 and 302 and/or DINP and DINN may be adjusted as the particular application allows.

A common mode reference signal VCM illustrates the signal levels for the amplified signals OUTP and OUTN when the input signals 301 and 302 are idle (e.g., no input signal is applied to the one-sided switching PWM amplifier 300). While the common mode signal 402 and the common mode reference signal VCM are equal when the input signals 301 and 302 are idle, VCM remains substantially at the same amplitude while the common mode signal changes when the input signals 301 and 302 and the amplified signals OUTP and OUTN change. For example, as one of the amplified signals OUTP and OUTN changes at a greater rate than the other of the amplified signals OUTN and OUTP. The common mode signal 402 is an imaginary signal used herein to illustrate one of the differences between the example PWM amplifier 300 and conventional PWM amplifiers.

The common mode reference signal level VCM is set slightly above (e.g., 10%) the minimum signal level of the half-swing modulation signal 312. The VCM signal level is chosen to avoid very short switching times at the gate drivers 314 and 316 that can cause distortion in an output signal. If the VCM signal level were chosen to be VDD/2 (i.e., as shown in the conventional configuration of FIG. 2), during periods of idle input signals 301 and 302 (which can happen frequently during audio signals) the amplified signals OUTP and OUTN would be constant at VDD/2, or the minimum signal level of the modulation signal 312. When the amplified signals OUTP and OUTN are compared to the modulation signal by respective ones of the comparators 308 and 310, the comparison can result in a very short switch of the PWM_P and PWM_N signals from logic low to logic high and back to logic low. This very short switch causes the gate drivers 314 and 316 to also switch. However, the gate drivers 314 and 316 typically cannot switch the output stage 322 as quickly as the PWM_P and PWM_N signals switch because the reverse recovery time on a low-side FET (e.g., 319, 321, or similar low-side FETs in the gate drivers 314 and 316) is relatively slow and/or because the example output stage 322 uses lower switching voltages. During a very fast switch from logic high to logic low, the low-side FET 319 or 321 cannot recover, which can cause distortion at the output VOUT. In contrast to the amplifier 100 of FIG. 1, the VCM signal level used in the PWM amplifier 300 prevents the distortion by increasing the pulse time to the comparators 308 and 310. As a result of the increased pulse time, the gate drivers 314 and 316 may recover and output a pulse having a correct pulse width. If the pulse time is too short, the comparators 308 and 310 and/or the gate drivers 314 and 316 may register very short pulses due to noise as in the integrated signals 202 and 204. The very short pulses may be output to the load 324 as a noise signal or "static" in an audio output.

The amplified signals OUTP and OUTN are generated by applying different resistances between the amplified signals OUTP and OUTN and a reference node. Only one of the comparators 308 or 310 has a switching output as the amplified signals OUTP and OUTN increase or decrease farther away from the VCM reference signal amplitude. The amplified signal OUTP and OUTN that is within the amplitude range of the modulation signal 312 (e.g., VDD to VDD/2) may use a large portion of the modulation signal 312 amplitude range to improve resolution. When the signals OUTP and OUTN have amplitudes that are close to VCM, both comparators 308 and 310 may switch during the same time. However, the switching that results from the OUTP and OUTN amplitudes that are close to VCM may be filtered at the output of the one-side PWM amplifier 300. If equal weights were applied to the amplified signals OUTP and OUTN as in the conventional configuration of FIGS. 1 and 2, either the amplified signals OUTP and OUTN would use an inappropriate voltage range (e.g., GND to VDD) compared to the modulation signal 312 voltage range (e.g., VDD/2 to VDD), or the VCM voltage level would have to be set to the minimum voltage of the modulation signal 312 voltage range (e.g., VDD/2), which would cause distortion in the output signal due to very short switches at the gate drivers 314 and 316.

The signals PWM_P and PWM_N illustrate pulse width modulated outputs from the respective comparators 308 and 310 as a result of comparing the amplified signals OUTP and OUTN with the modulation signal 312. As illustrated in FIG. 4, when the amplitude of the OUTP signal is lower than the amplitude of the modulation signal 312 (in other words, OUTP is "lower than" the modulation signal 312), the PWM_P signal output from the comparator 308 is at logic high. Conversely, when the amplitude of the OUTP signal is higher than the amplitude of the modulation signal 312 (in other words, OUTP is "higher than" the modulation signal 312), the PWM_P signal output from the comparator 308 is at logic low. Similarly, when OUTN is higher than the modulation signal 312, the PWM_N signal output from the comparator 308 is at logic low. When OUTN is lower than the modulation signal 312, the PWM_N signal output from the comparator 308 is at logic high. A differential PWM output signal 404 illustrates the unfiltered output of the one-sided PWM amplifier 300, which is the difference between the PWM signals PWM_P and PWM_N.

Figure 4A:
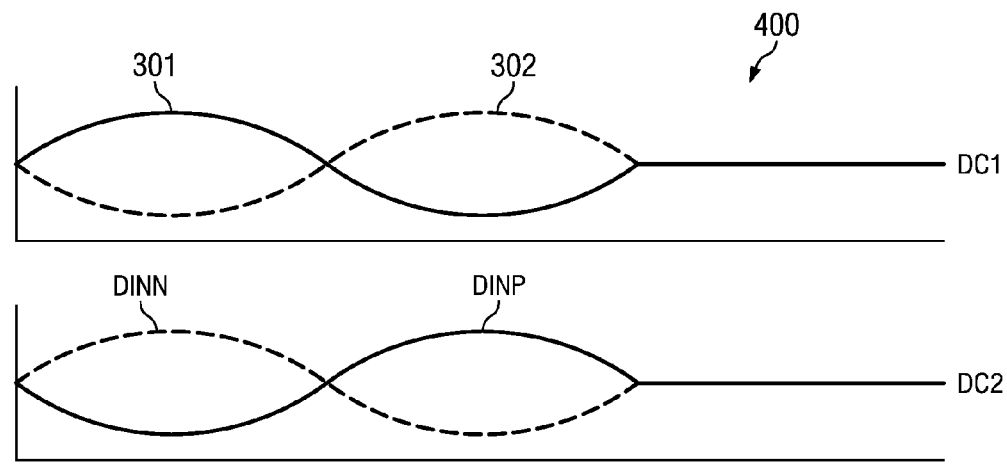
FIGS. 4A and 4B illustrate a set of waveforms generated by the one-sided switching pulse width modulation amplifier of FIG. 3.
Figure 4B:
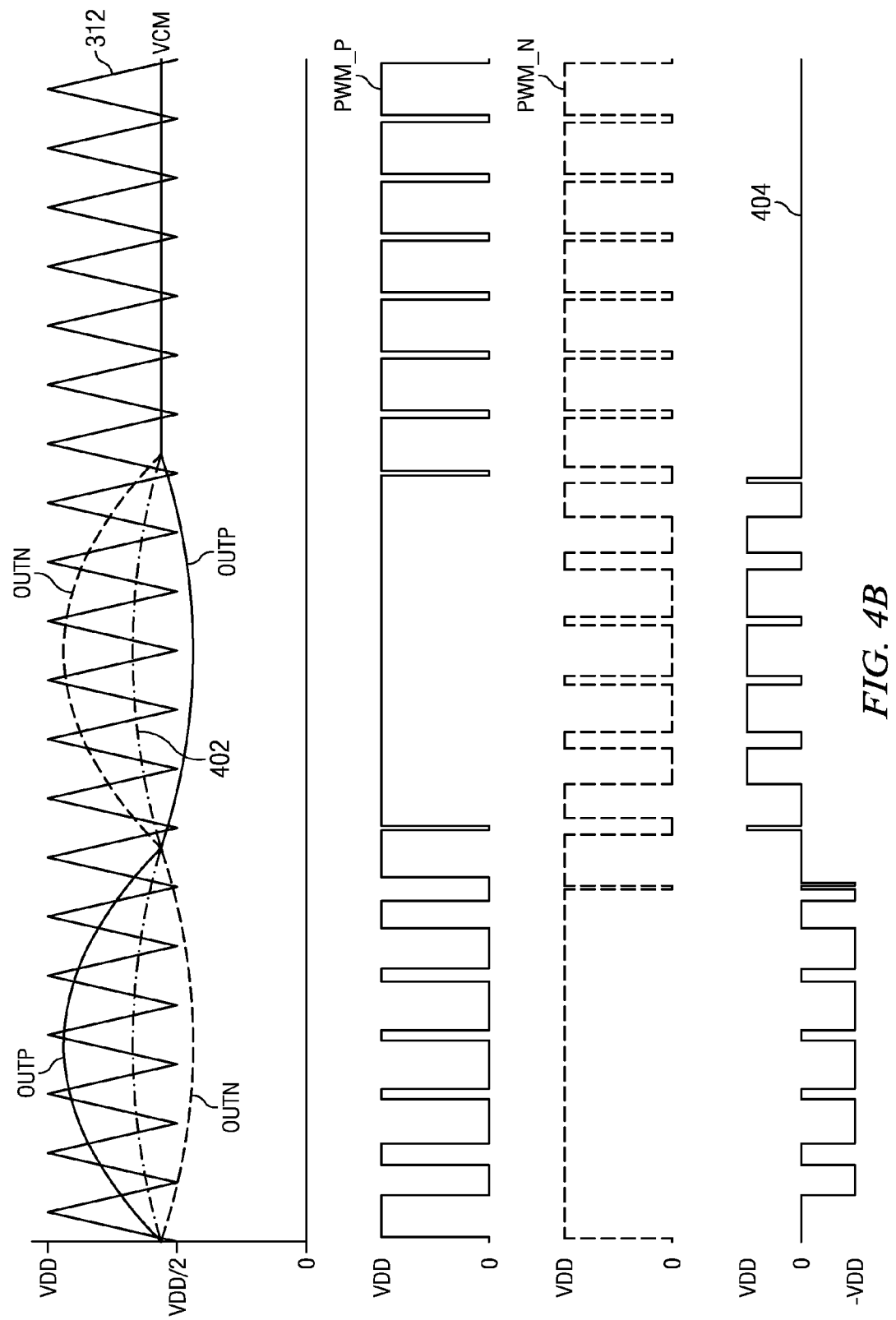

As illustrated in FIGS. 4A and 4B, the output signal VOUT is the difference between the signals PWM_P and PWM_N, with the polarity of VOUT using PWM_P as the positive reference and PWM_N as the negative reference. The example VOUT illustrated in FIG. 4 is also shown without filtering. As a result, the VOUT signal has a range between VDD and −VDD. While the signal PWM_P is switching as a result of the comparison between OUTP and the modulation signal 312, PWM_N switches briefly and then is constant at VDD. PWM_P switches between VDD and 0, so the pulses of PWM_P results in corresponding pulses at VOUT ranging between 0 and −VDD. In contrast, when the signal PWM_N is switching as a result of the comparison between OUTN and the modulation signal, PWM_P switches briefly and then is constant at VDD. Thus, PWM_N switches between VDD and 0, and causes corresponding pulses at VOUT ranging between VDD and 0. For many audio speakers, the polarity of the switching does not impact the sound that is generated. Thus, the switching of VOUT is not affected by the polarity and the reduced switching draws reduced power.

In contrast to the conventional modulation 200 illustrated in FIG. 2, the common mode signal 402 changes significantly as the amplified signals OUTP and OUTN increase or decrease farther away from VCM. The change in the common mode signal 402 is caused by the greater weight applied to the amplified signals OUTP and OUTN by adjusting the resistances between the amplified signals OUTP and OUTN and a reference node. When the amplified signals OUTP and OUTN switch relative polarities, the weight applied to generate the amplified signals OUTP and OUTN also switches. As a result, the common mode signal 402 increases as the signals OUTP and OUTN diverge from the common mode 402 or VCM, and decreases to a signal level where the integrated signals OUTP and OUTN are substantially equal again as the integrated signals OUTP and OUTN converge on the common mode 402 of VCM. The common mode signal 402 does not decrease below VCM because the signal OUTP or OUTN that has a higher amplitude also has a higher weight applied to it.

As the input signals 301 and 302 approach their DC (or idle) values, the amplified signals OUTP and OUTN approach an amplitude corresponding to approximately a 90% (or 10%) pulse width for the PWM signals PWM_P and PWM_N, or VCM. As a result, when no input signal is present at the first integrator 303, the amplified signals OUTP and OUTN converge at 90% (or 10%) pulse width. In some other examples, the pulse widths for the PWM signals PWM_P and PWM_N are between 85% and 95% (or 5% and 15%) when the input signals 301 and 302 approach their DC values. In contrast, the conventional signals 202 and 204 of FIG. 2 approach an amplitude corresponding to a PWM pulse width of 100% (i.e., VDD/2) when the input signal is idle. If the amplified signals OUTP and OUTN approached an amplitude corresponding to a 100% pulse width (i.e., VCM=VDD/2), very small pulses would occur as the comparators 308 and 310 compared the amplified signals OUTP and OUTN to the modulation signal 402. The very small pulses cause distortion in the output signal due to the difficulty in high speed switching at the gate drivers 314 and 316. Failed switching and/or noise on OUTP and OUTN may cause incomplete or mistimed pulses which, in the case of audio amplification, causes the output VOUT to output audible sounds at undesired times. At a 90% (or 10%) pulse width, the gate drivers 314 and 316 have sufficient time to switch the NFETs of the output stage 322. The net output to the load 324 remains the difference between identical signals, or zero.

Figure 5:
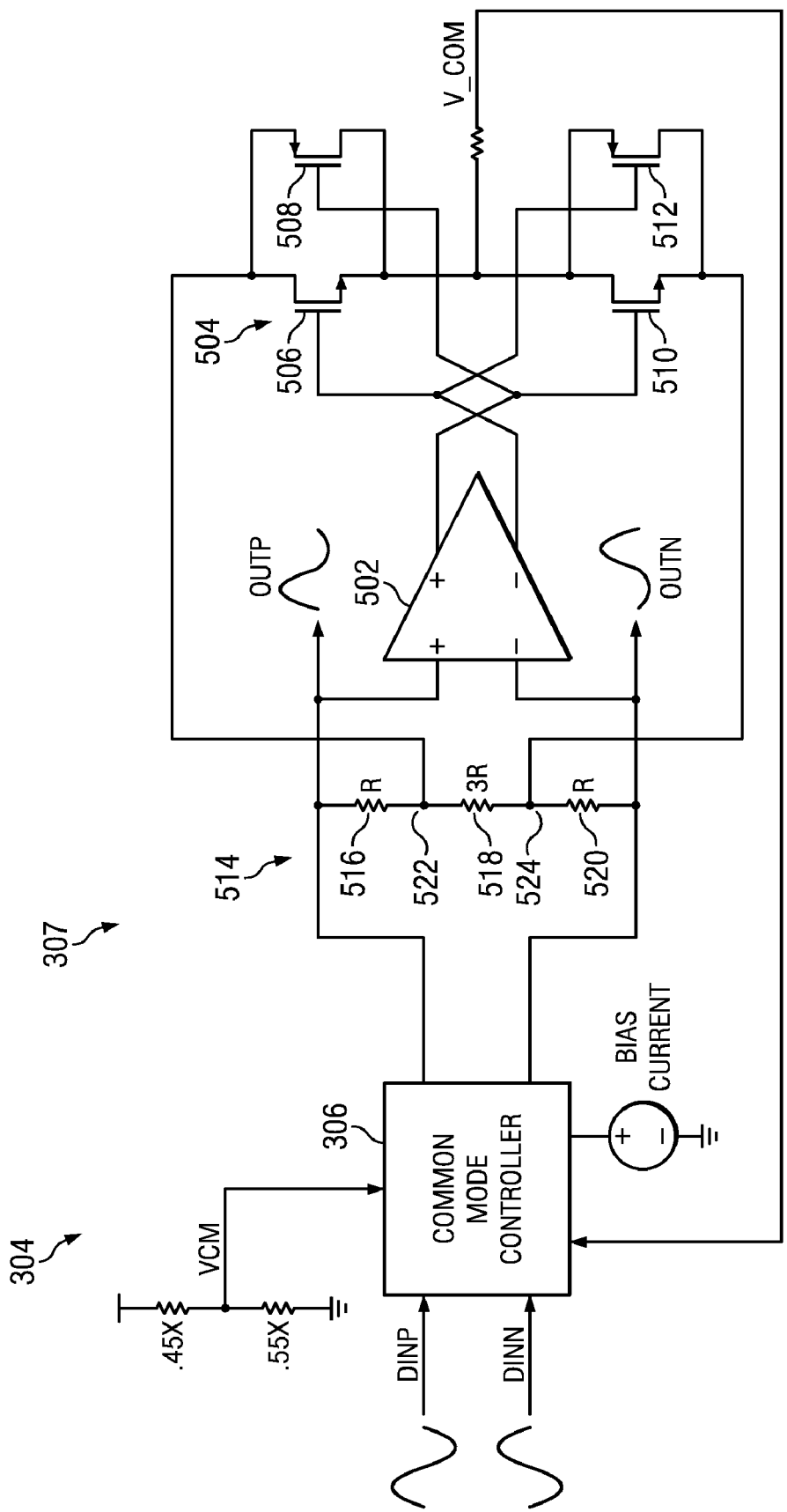
FIG. 5 is a schematic view of an example integrator including a common mode controller and a reference changer used to implement the one-sided switching pulse width modulation amplifier of FIG. 3.

FIG. 5 is a schematic view of an example integrator 304 including a common mode controller 306 and a reference changer 307 used to implement the one-sided switching pulse width modulation amplifier 300 of FIG. 3. The integrator 304 receives differential input signals DINP and DINN and a current bias signal and generates amplified signals OUTP and OUTN. In general, the example integrator 304 determines the relative amplitudes based on DINP and DINN to generate amplified signals OUTP and OUTN. For example, when the amplitude of DINP is higher than the amplitude of DINN, the corresponding amplified signal OUTP has a higher weight and the complementary amplified signal OUTN has a lower weight, where the weights are relative to a reference amplitude.

The reference changer 307 includes a comparator 502 to receive the amplified signals OUTP and OUTN from the common mode controller 306. The comparator 502 compares the signals OUTP and OUTN, and outputs a logic high signal from the non-inverting output if the signal OUTP is higher. The comparator 502 also provides an inverted output to be a logically opposite signal from the non-inverting output. The reference changer 307 further includes a transistor network 504 responsive to the comparator 502 outputs. Switching elements (e.g., high side transistors) 506 and 508 are turned on (e.g., conducting) when OUTN is higher than OUTP (i.e., the inverted output of the comparator 502 is logic high), and switching elements (e.g., low side transistors) 510 and 512 are turned on (e.g., conducting) when OUTP is higher than OUTN (i.e., the non-inverted output of the comparator 502 is logic high).

The reference changer 307 further includes a resistor network 514. The resistor network 514 couples OUTP to OUTN, and includes resistors 516, 518, and 520 selected to have a predetermined resistance ratio. The resistor network 514 ratio determines the gain or weight applied to OUTP and OUTN at any given time. In the illustrated example, the resistor network 514 includes resistors 516, 518, and 520 having a ratio of R, 3R, and R, respectively. For example, the resistor 516, 518, and 520 values may be implemented using 20 kΩ, 60 kΩ, and 20 kΩ resistors, respectively. The switching elements 506 and 508 selectively couple a first reference node 522 between the resistors 516 and 518 to the common mode input V_COM. Similarly, the switching elements 510 and 512 selectively couple a second reference node 524 between resistors 518 and 520 to the common mode input V_COM. One of the reference nodes 522 or 524 is coupled to the common mode input V_COM at any given time due to the comparator 502 output and the transistor network 504.

For example, if OUTP has a higher amplitude than OUTN, the comparator 502 turns on the switching elements 510 and 512. As a result, the second reference node 524 is coupled to the common mode input V_COM, setting the amplitude at the second reference node 524 to V_COM. Due to the ratio of the resistance between OUTP and the second reference node 524, and the resistance between OUTN and the second reference node 524 (i.e., 4:1), OUTP increases at a 0.8 X rate compared to the OUTN increase rate of 0.2 X as amplitudes of the analog signals DINP and DINN diverge from VCM. Similarly, when OUTN has a higher amplitude than OUTP, the first reference node 522 is coupled to V_COM via switching elements 506 and 508. As a result, OUTN changes at an 0.8 X rate while OUTP changes at a 0.2 X rate. The amplified signals OUTP and OUTN have a differential voltage applied by the common mode controller 306, and the combination of the resistor network 514 and the reference nodes 522 and 524 cause weights to be applied to the amplified signals OUTP and OUTN with respect to one of the reference nodes 522 or 524, depending on the relative amplitudes of OUTP and OUTN. The resistor value ratios of the resistor network 514 may be modified to change the desired weights applied to OUTP and OUTN.

Figure 6:
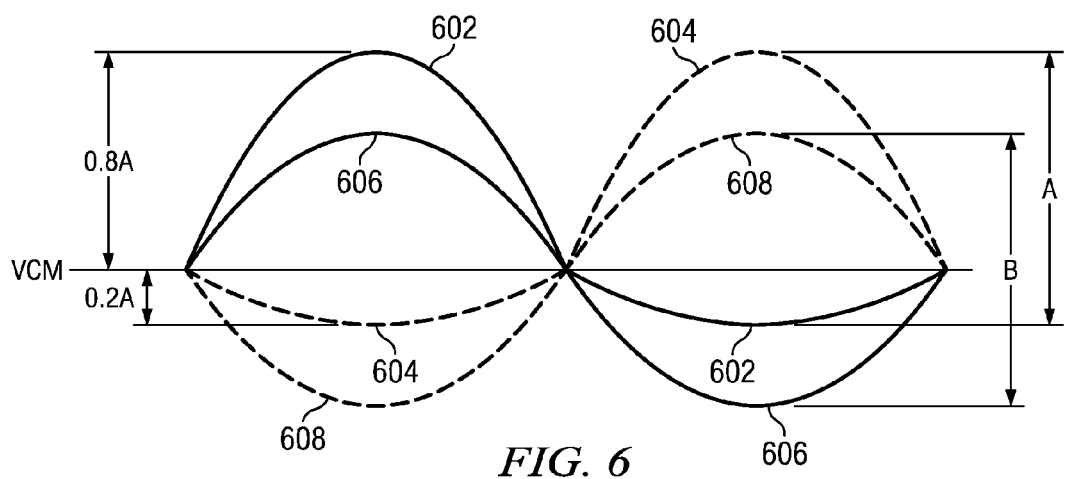
FIG. 6 illustrates example amplified signals that may be generated by the reference changer of FIG. 5 shown in comparison with conventional integrated signals that may be used by the conventional pulse width modulation amplifier of FIG. 1.

FIG. 6 illustrates example amplified signals 602 and 604 (e.g., OUTP and OUTN) that may be generated by the reference changer 307 of FIG. 5 shown in comparison with conventional integrated signals 606 and 608 (e.g., 202 and 204 of FIG. 2) that may be used by the conventional PWM amplifier of FIG. 1. To illustrate the effect of different respective weights on the signals 602-608, the difference in the common mode voltage VCM is not shown. In operation, the amplitude of VCM for the amplified signals 602 and 604 would be higher than the amplitude of VCM for the conventional integrated signals 606 and 608. The conventional signals 606 and 608 have substantially equal weights and/or amplitudes and are centered on a constant VCM. The voltage difference between the conventional signals 606 and 608 at any given time is expressed in FIG. 6 as B. Thus, the voltage difference between either of the conventional signals 606 or 608 and VCM is 0.5 B.

In contrast, the example integrated signals 602 and 604 are weighted unequally with respect to VCM. In other words, the absolute values of the amplitudes of the integrated signals 602 and 604 are unequal with respect to VCM. As illustrated in FIG. 6, at any given time the amplitude difference between OUTP and OUTN may be expressed as A. When OUTP is greater than OUTN as determined by the comparator 502, OUTP is weighted according to the resistor network 514 and, in the example illustrated, changes at a rate of 0.8 A. OUTN is also weighted according to the resistor network 514 and changes at a rate of 0.2 A. Similarly, when OUTN is greater than OUTP as determined by the comparator 502, OUTN changes at a rate of 0.8 A and OUTP changes at a rate of 0.2 A.

Figure 7:
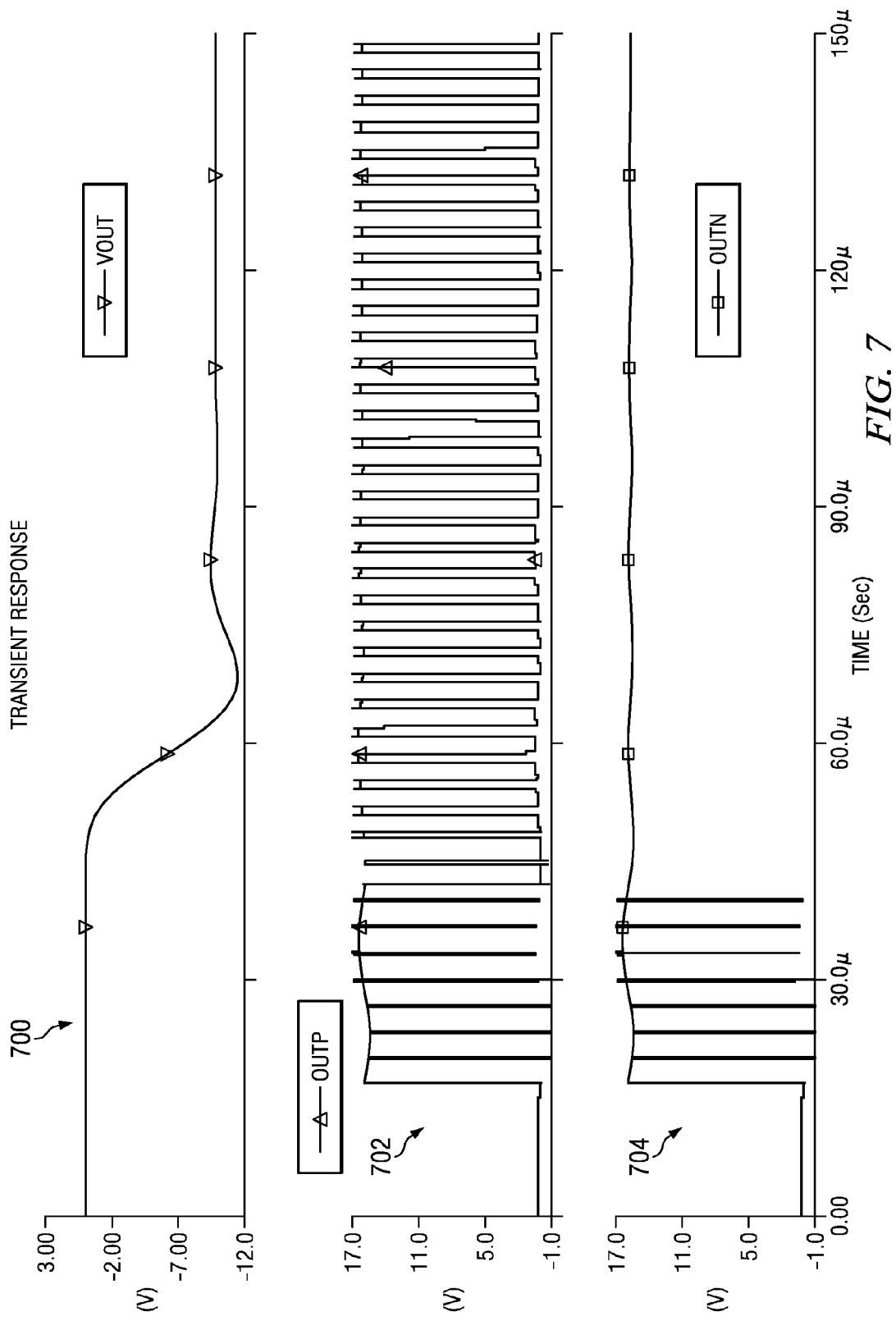
FIG. 7 illustrates a filtered output signal as a function of the pulse width modulated signals generated by the example one-sided switching pulse width modulation amplifier of FIG. 3.

FIG. 7 illustrates a filtered output signal 700 as a function of the pulse width modulated signals 702 and 704 generated by the example one-sided switching pulse width modulation amplifier 300 of FIG. 3. The example output signal 700 is a function of the PWM signals 702 and 704 (i.e., PWM_P and PWM_N signals output from the comparators 308 and 310) representative of OUTP and OUTN, respectively. A filter (e.g., the filters 326 and 328) is applied to the raw output signal(s) generated by the output stage 322 (e.g., the difference between the PWM signals 702 and 704) to smooth the output. The example output signal 700 begins having no (i.e., zero) output signal, corresponding to no input signal. As described above, the pulse width modulated signals 702 and 704 both have approximately 90% duty cycles when the input signal is idle. The PWM signals 702 and 704 switch at the same times, because the amplified signals OUTP and OUTN signals are equal and compared to the same modulation signal. Thus, the resulting output signal 700 (i.e., the difference between the PWM signals 702 and 704) is, therefore, zero (e.g., 0 volts).

As OUTP decreases and OUTN increases, the pulse width of the PWM signal 702 increases. In contrast, the PWM signal 704 stops switching and has a 100% duty cycle due to the decrease in OUTN below the lower limit (e.g., VDD/2) of the modulation signal (e.g., the modulation signal 312 of FIG. 3). As a result, the output signal 702 is proportional to the pulse width of the PWM signal 704. Due to the filtering, the output signal 700 stays at a substantially constant voltage while the PWM signals 702 and 704 maintain constant pulse widths.

Figure 8:
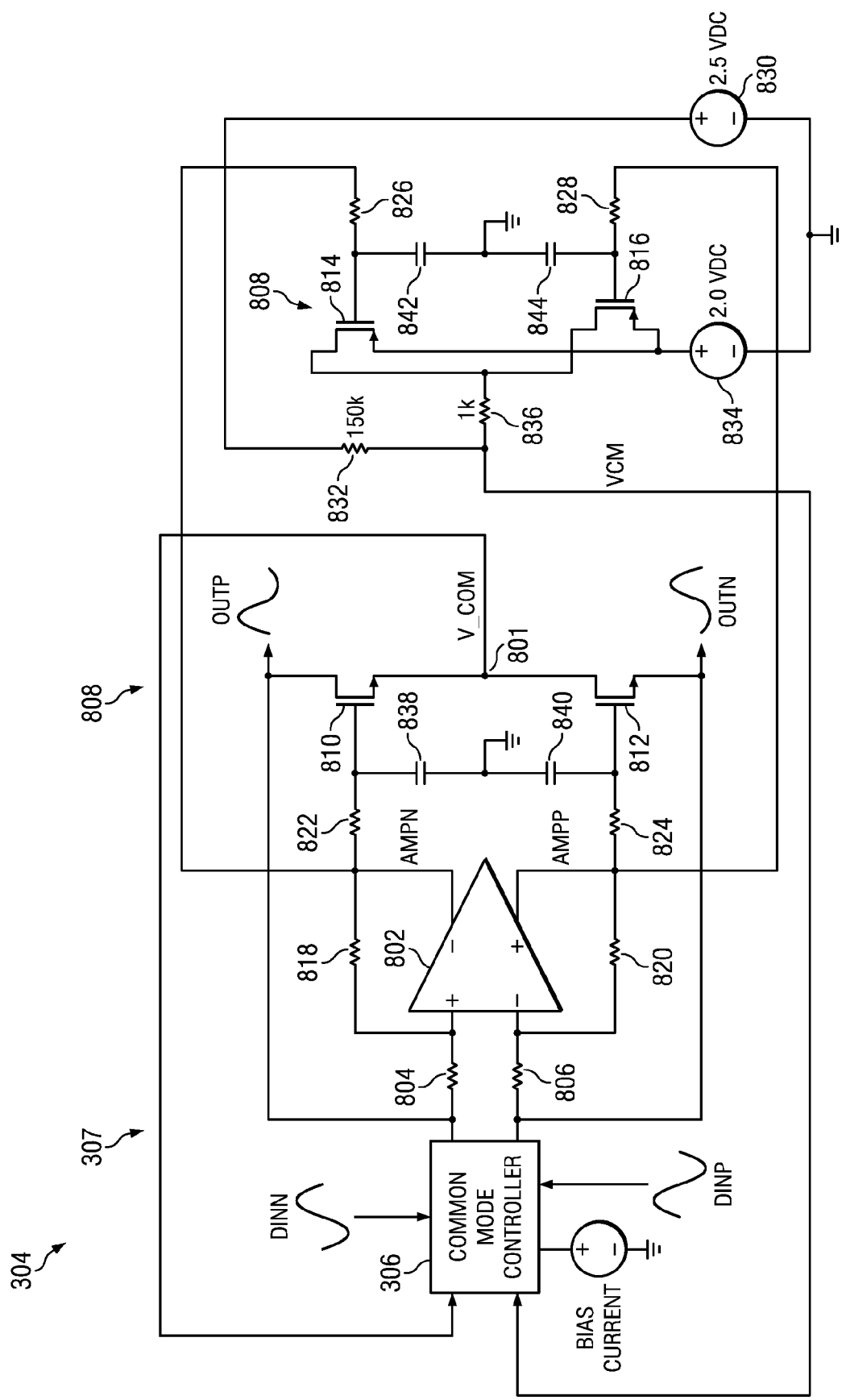
FIG. 8 is a schematic view of another example integrator including a common mode controller and a reference changer to implement the one-sided switching pulse width modulation amplifier of FIG. 3.

FIG. 8 is a schematic view of another example integrator 304 including a common mode controller 306 and a reference changer 307 to implement the one-sided switching PWM amplifier 300 of FIG. 3. The integrator 304 receives analog input signals DINP and DINN and a current bias signal and generates amplified signals OUTP and OUTN. In general, the example integrator 304 determines the relative amplitudes based on OUTP and OUTN and applies higher and lower resistances between a reference node 801 and the amplified signals OUTP and OUTN. For example, when the amplitude of OUTP is higher than the amplitude of OUTN, the reference changer 307 applies a higher resistance between the reference node 801 and the corresponding amplified signal OUTP, and applies a lower resistance between the reference node 801 and the amplified signal OUTN.

The common mode controller 306 receives the differential input signals DINP and DINN, a common mode signal V_COM at the reference node 801, and a common mode reference VCM, and outputs the amplified signals OUTP and OUTN. The common mode controller 306 causes a differential voltage between OUTP and OUTN based on the differential voltage between the input signals DINP and DINN and based on a differential gain. The operation of the common mode controller 306 is described in more detail with respect to FIG. 11 below.

The reference changer 307 includes an amplifier 802 to determine which of the amplified signals OUTP and OUTN has a higher amplitude. The common mode controller 306 outputs the amplified signals OUTP and OUTN to the amplifier 802 via resistors 804 and 806. The amplifier 802 determines the difference between the amplified signals OUTP and OUTN and applies differential output signals AMPP and AMPN to a switching network 808, which includes switching elements 810, 812, 814, and 816. The output signal AMPN increases and decreases proportionally to OUTP. Similarly, the signal AMPP increases and decreases proportionally to OUTN. The signals AMPP and AMPN are further fed back to the input terminals of the amplifier 802 via resistors 818 and 820. The signals AMPP and AMPN are also coupled to the switching elements 810-816 via respective resistors 822, 824, 826, and 828.

The switching elements 810 and 812 couple the amplified signals OUTP and OUTN to the reference node 801 (i.e., common mode signal V_COM) and to each other via respective first and second resistances. The switching elements 810 and 812 are both n-channel switching elements (e.g., n-channel junction field effect transistor (JFET), n-channel metal-oxide-semiconductor field effect transistor (MOSFET)). Each provides a drain-source resistance ($R_{DS}$) based on the respective amplifier 802 output signal AMPP or AMPN. For example, the switching element 810 provides a resistance between OUTP and the reference node 801 based on the signal AMPN. Similarly, the switching element 812 provides a resistance between OUTN and the reference node 801 based on the signal AMPP. Together, the switching elements 810 and 812 provide a voltage divider between OUTP and OUTN. The finite resistances of 810 and 812 may be manipulated to increase and decrease the amplitudes of OUTP and OUTN with respect to the reference node 801.

When the signal OUTP has a higher amplitude than the signal OUTN, the amplifier 802 causes the amplitude of AMPP to increase and the amplitude of AMPN to decrease. As a result, the resistance of the n-type switching element 810 increases due to the corresponding control signal AMPN decreasing in amplitude. The resistance of the n-type switching element 812 decreases due to the control signal AMPP increasing in amplitude. Thus, the switching elements 810 and 812 operate to control the amplitude differences between the amplified signals OUTP and OUTN and the reference node 801. When the amplitude of OUTP is higher than the amplitude of OUTN, the resistance between OUTP and the reference node 801 is increased and the resistance between OUTN and the reference node 801 is decreased, which increases the amplitude difference between OUTP and the reference node 801 relative to the amplitude difference between OUTN and the reference node 801. In contrast, when the amplitude of OUTP is lower than the amplitude of OUTN, the resistance between OUTP and the reference node 801 is decreased and the resistance between OUTN and the reference node 801 is increased, which increases the amplitude difference between OUTN and the reference node 801 relative to the amplitude difference between OUTP and the reference node 801.

The amplifier 802 output signals AMPP and AMPN further control drain-source resistances of the example n-type switching elements 814 and 816 via the resistors 826 and 828. The switching elements 814 and 816 generally control the common mode reference signal VCM to remain at a substantially fixed reference amplitude. In the illustrated example, the reference amplitude is controlled by a direct current (DC) voltage source 830, which produces a substantially constant 2.5 volts DC (VDC). The common mode reference signal VCM is coupled to the source 830 via a resistor 832 having a relatively large resistance value (e.g., 150 kilo ohms (kΩ)). The switching elements 814 and 816 selectively couple the signal VCM to a second DC voltage source 834 via a resistor 836. The example DC voltage source 834 supplies 2.0 VDC. The resistor 836 has a much lower resistance value than the resistor 832. Although the example resistor 836 has a 1 kΩ resistance value, other resistance values are possible based on the application.

The example reference changer 307 further includes filter capacitors 838, 840, 842, and 844. The filter capacitors 838 and 840 filter any transients from the control terminals of the switching elements 810 and 812, respectively. The filter capacitors 842 and 844 filter transients from the control terminals of the switching elements 814 and 816, respectively. In some examples, the filter capacitors 838-844 are not needed.

The signal AMPP controls the switching element 816 via the resistor 828 and the signal AMPN controls the switching element 814 via the resistor 826. The drain-source resistances of the switching elements 814 and 816 are substantially in parallel, coupling VCM to the voltage source 834. When the amplified signal OUTP has a higher amplitude than OUTN, the signal AMPN decreases the resistance of the switching element 814 and the signal AMPP increases the resistance of the switching element 816. However, the same effect is reached with respect to the signal VCM when the amplified signal OUTN has a higher amplitude than OUTP. As the amplitude of OUTP increases when OUTP is higher than OUTN and/or as the amplitude of OUTN increases when OUTN is higher than OUTP, the resistance between the common mode reference signal VCM and the voltage source 834 decreases and causes VCM to decrease.

V_COM (i.e., the reference node 801) and VCM are fed back to the common mode controller 306, which generally places pressure on V_COM and VCM to be equal or substantially equal in amplitude. VCM is considered the reference voltage that has a reference amplitude to which the common mode controller 306 tries to match V_COM. V_COM and VCM further determine the common mode of OUTP and OUTN via the common mode resistance 306. The resistors 832 and 836 and the switching elements 814 and 816 control the resistance between VCM and the voltage sources 830 and 834. VCM increases and decreases based on the resistances of the switching elements 814 and 816, which causes V_COM to increase and decrease accordingly.

Figure 9:
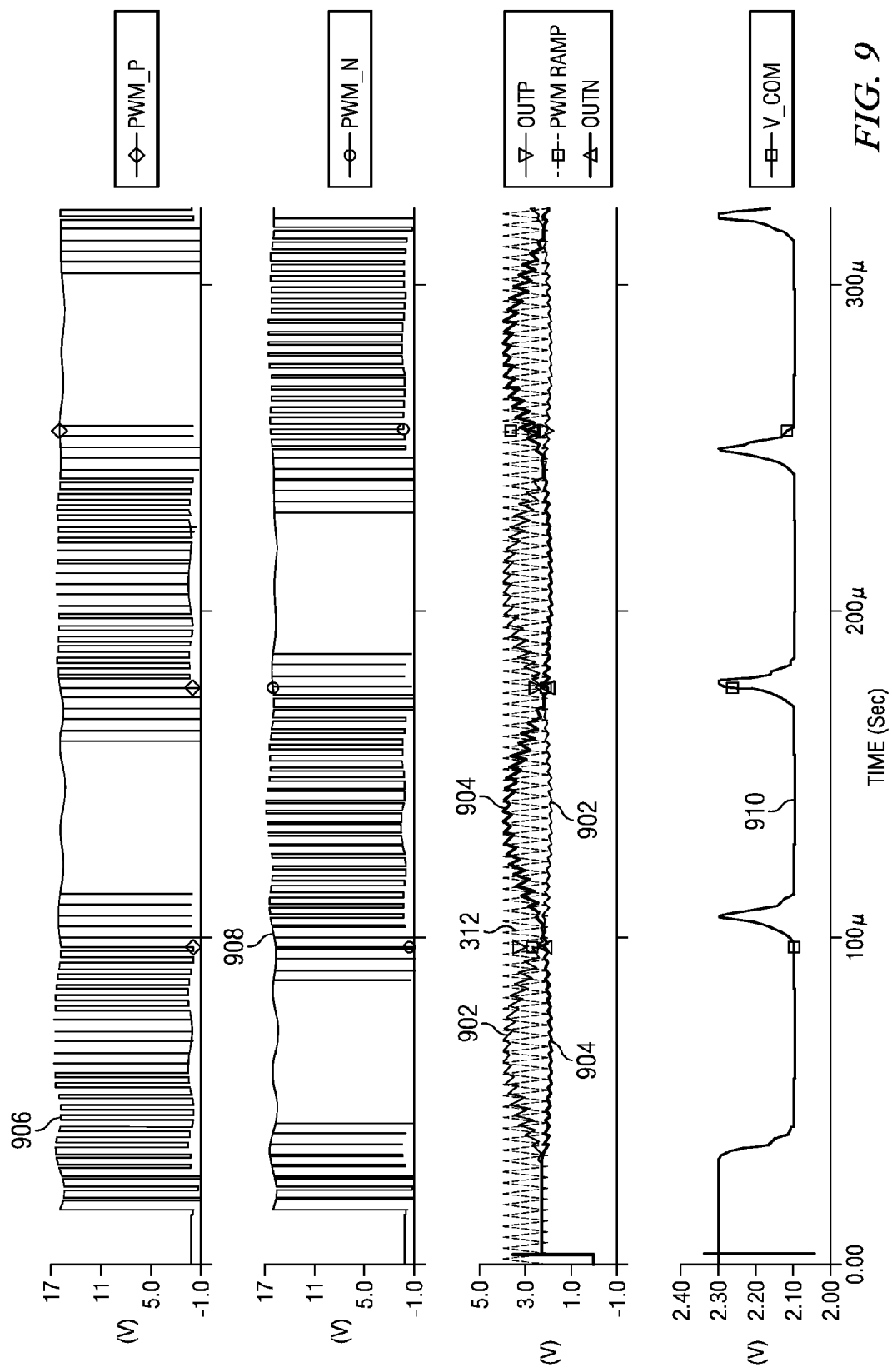
FIG. 9 illustrates signals generated by the example reference changer of FIG. 8.

FIG. 9 illustrates signals generated by the example one-sided switching pulse width modulation amplifier 300 and the example reference changer 307 of FIG. 8. The example reference changer 307 outputs OUTP 902 and OUTN signals 904 based on differential input signals DINP and DINN (not shown in FIG. 9). The OUTP signal 902 is compared to the modulation signal 312 at the comparator 308, which outputs a PWM_P signal 906 based on the comparison. Similarly, the comparator 310 compares the modulation signal 312 to the OUTN signal and generates a PWM_N signal 908.

FIG. 9 further illustrates the V_COM signal 910 generated by the reference changer 307. As mentioned above, the common mode controller 306 causes VCM to be approximately equal to V COM via feedback. The VCM reference signal 910 increases to approximately 2.3 V when the DINP and DINN signals (and, thus, OUTP 902 and OUTN 904) are idle. As OUTP 902 and/or OUTN 904 increases, the resistance provided by the switching elements 814 and/or 816 of FIG. 8 decreases, thereby decreasing the resistance between VCM and the voltage source 834. As VCM decreases toward the voltage supplied by the voltage source 834, the common mode controller 306 causes V_COM to decrease accordingly. The change in V_COM allows the PWM_P and PWM_N signals to be larger when the DINP and DINN inputs signals are idle.

Figure 10:
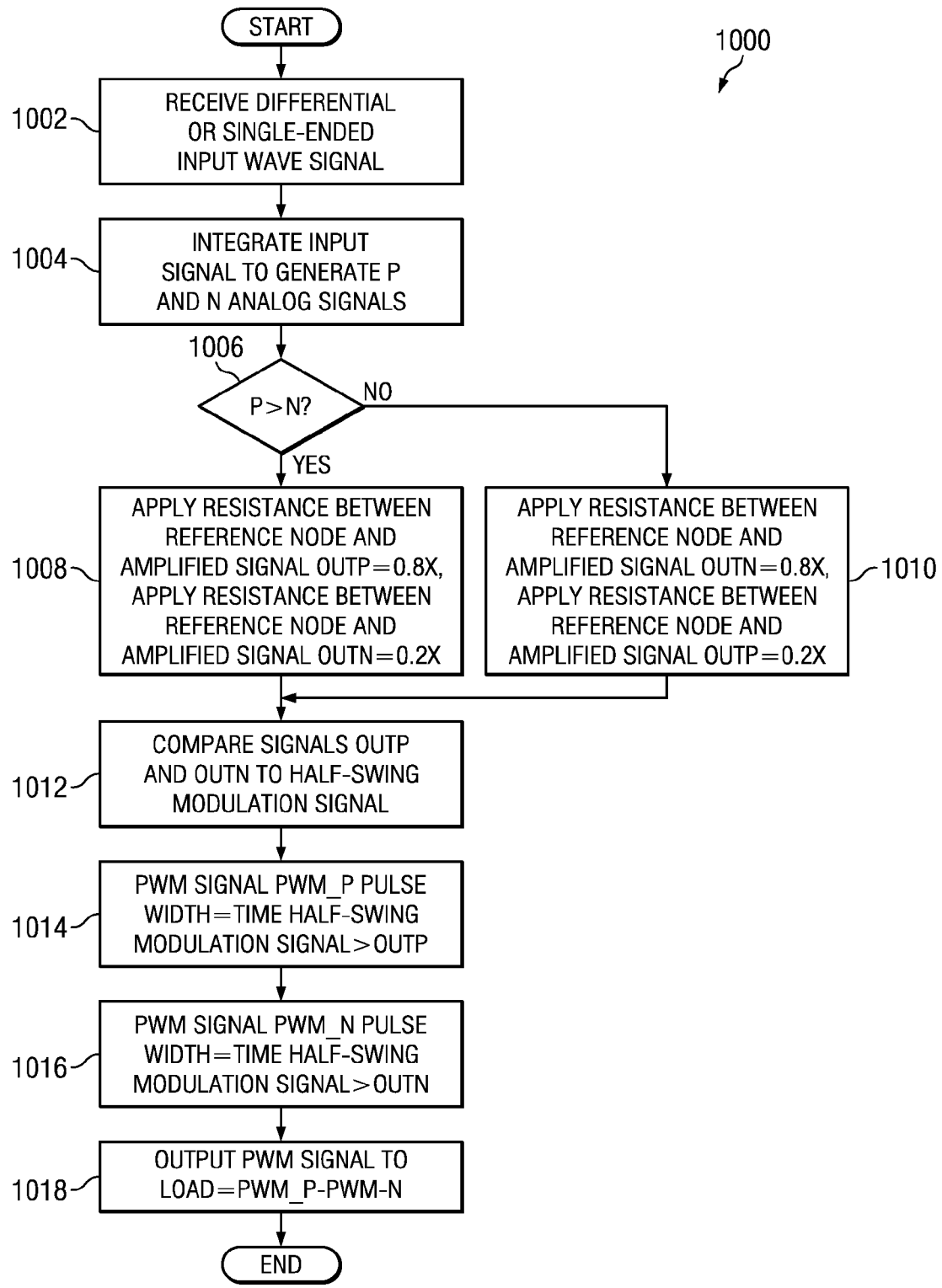
FIG. 10 is a flowchart illustrating an example process performed by the one-sided switching pulse width modulation amplifier of FIG. 3.

FIG. 10 is a flowchart illustrating an example method 1000 to implement the one-sided switching pulse width modulation amplifier 300 of FIG. 3. The method 1000 receives an input signal and generates a pulse-width modulated output signal. To begin, the example amplifier 300 receives a differential or single-ended input signal (block 1002). The amplifier 300 may receive the input signal via, for example, the first integrator 303 of FIG. 3. The first integrator 303 integrates the input signal to generate P and N analog signals (block 1004). The P and N analog signals are generally differential signals.

The example amplifier 300 then compares the P analog signal to the N analog signal (block 1006). The comparison may be performed by, for example, the comparator 502 of FIG. 5 or the amplifier 802 of FIG. 8. If the analog signal P (e.g., the amplitude of P) is greater than the analog signal N (e.g., the amplitude of N) (block 1006), the example reference changer 307 applies a first resistance of 0.8 X between a reference node (e.g., the reference node 524 of FIG. 5 and/or the reference node 801 of FIG. 8) and the amplified signal OUTP, and applies a second resistance of 0.2 X to between the reference node and the amplified signal OUTN (block 1008). In contrast, if the amplitude of N is greater than the amplitude of P (block 1006), the example reference changer 307 applies a first resistance of 0.8 X between a reference node (e.g., the reference node 522 of FIG. 5 and/or the reference node 801 of FIG. 8) and the amplified signal OUTN, and applies a second resistance of 0.2 X to between the reference node and the amplified signal OUTP (block 1010). To apply the first and second resistances, the example reference changer 307 may designate a different reference node 522 or 524 as illustrated in FIG. 5 or may adjust the resistances and between the amplified signals OUTP and OUTN and a fixed reference node 801 as illustrated in FIG. 8. In blocks 1008 and 1010, X may be any appropriate scalar and may be set by configuring the resistor network 514 of FIG. 5 or the resistors 818-828 and/or switching elements 810 and/or 812 of FIG. 8.

After applying the appropriate resistances based on the comparison (blocks 1006-1010), the comparators 308 and 310 of FIG. 3) compare the respective signals OUTP and OUTN to a half-swing modulation signal (block 1012). Based on the comparison, the example comparator 308 outputs a PWM signal PWM_P having a pulse width equal to the time the modulation signal is greater than (i.e., has an amplitude higher than) OUTP (block 1014). Similarly, the example comparator 310 outputs a PWM signal PWM_N having a pulse width equal to the time the modulation signal is greater than OUTN (block 1016). An output stage (e.g., the H-bridge 322 of FIG. 3) generates an output signal to a load (e.g., the load 324 of FIG. 3) equal to the difference between PWM_P and PWM_N (block 1018). The example method 1000 may be iterated to generate a continuous output waveform based on a continuous input waveform.

Figure 11:
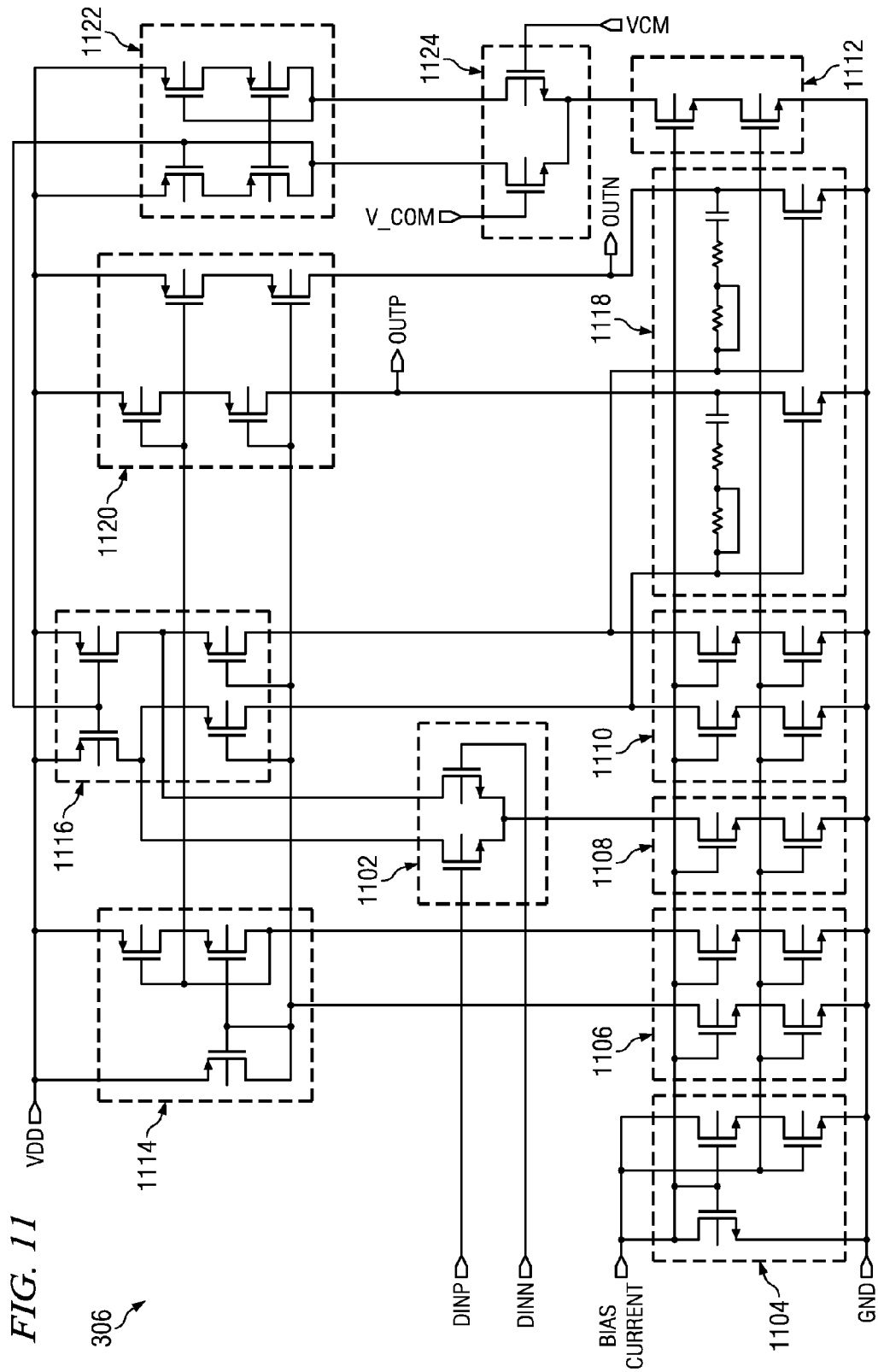
FIG. 11 is a schematic view of an example common mode controller to implement the common mode controller of FIG. 3.

FIG. 11 is a schematic view of an example common mode controller 306 to implement the common mode controller 306 of FIG. 3. The common mode controller 306 includes a differential amplifier input stage 1102 to receive the differential signals DINP and DINN. The common mode controller 306 further includes current mirrors 1104, 1106, 1108, 1110, and 1112. A bias current input is used to set the bias current at the current mirror 1104, which controls the currents through the remaining current mirrors 1106-1112. The current mirrors 1106-1112 control the currents in the common mode controller 306 with respect to a ground reference GND. The current mirror 1106 controls the current through an additional current mirror 1114, which controls the current in the common mode controller 306 with respect to the power supply voltage VDD.

Based on the differential input signals DINP and DINN, the differential amplifier input stage 1102 controls the differential voltages to a differential amplifier load 1116. A class-A differential amplifier output stage 1118 is controlled by the differential amplifier load 1116 and the differential amplifier input stage 1102 (i.e., the DINP and DINN). The output stage 1118 generates the signals OUTP and OUTN having a differential gain based on the bias current. An additional current mirror 1120, which is controlled by the current mirror 1114, controls the output current of OUTP and OUTN with respect to VDD. As the differential input signal DINP increases and the differential input signal DINN decreases, the signal OUTP increases and the signal OUTN decreases via the differential amplifier loads 1110 and 1116, the current mirror 1120, and the class-A amplifier output stage 1118. In contrast, as the differential input signal DINN increases and the differential input signal DINP decreases, the signal OUTN increases and the signal OUTP decreases.

The current mirror 1112 and a load 1122 provide a load on a common mode input stage 1124. The load 1122 attempts to keep the common mode signals VCM and V_COM substantially equal. As VCM increases or decreases as described above with reference to FIGS. 5 and 8, the load attempts to maintain the current drawn through each branch of the current to be equal. The load 1122 is also fed back to the current mirror 1116 to control the common mode amplitude of the amplified signals OUTP and OUTN. Thus, as VCM and V_COM increase, OUTP and OUTN both increase via the load 1122, the differential amplifier load 1116, and the class-A amplifier 1118.

While some example logic is shown to implement the methods and apparatus described herein, many other implementations are applicable. Any combination of logic methodologies may be used to implement the methods and apparatus described herein. The advantages of some logical methods over others will be apparent, and the selection of the implementation will be dependent on the application.

Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. An apparatus comprising:
    an integrator that is configured to receive first and second analog signals and to output a first amplified signal and a second amplified signal based at least in part on the first and second analog signals wherein the integrator includes a reference changer that determines whether a first amplitude is higher than a second amplitude based at least in part on the first and second analog signals, and wherein the reference changer selectively applies a first resistance between a reference node and a first output node that receives the first amplified signal and selectively applies a second resistance between the reference node and a second output node that receives the second amplified signal when the first amplitude is higher than the second amplitude, and wherein the reference changer selectively applies the second resistance between the reference node and the first output node and selectively applies the first resistance between the reference node and the second output node when the second amplitude is higher than the first amplitude; and
    first and second comparators coupled to the integrator to receive the first and second amplified signals, wherein the first and second comparators compare the first and second amplified signals to a reference signal and output first and second pulse width modulated (PWM) signals having respective first and second pulse widths based at least in part on the comparisons between the first and second amplified signals and the reference signal.

2. The apparatus of claim 1, wherein the integrator further comprises a common mode controller that receives the first and second analog signals, a common mode reference having a reference amplitude higher than a lower amplitude of the reference signal, and a common mode signal, and wherein the common mode controller generates the first and second amplified signals based on the first and second analog signals and the common mode signal.

3. The apparatus of claim 2, wherein the first and second amplitudes are substantially equal to the reference amplitude when the first and second analog signals are idle.

4. The apparatus of claim 2, wherein the reference changer changes the first and second resistances to cause the first amplified signal to change at a greater rate than the second amplified signal when the first amplitude is higher than the second amplitude, and to cause the second amplified signal to change at a greater rate than the first amplified signal when the second amplitude is higher than the first amplitude.

5. The apparatus of claim 1, wherein the reference changer further comprises:
    a comparator to receive the first and second amplified signals and to determine whether the first amplitude is higher than the second amplitude; and
    a resistor network coupled to the comparator and coupled between the first and second amplified signals, wherein the first resistance and the second resistance are based on the resistor network.

6. The apparatus of claim 5, wherein the reference changer further comprises a switching network coupled to the comparator, wherein the comparator causes the switching network to selectively couple a common mode signal to a first resistor network node or a second resistor network node based on whether the first amplitude is higher than the second amplitude.

7. The apparatus of claim 6, wherein the first resistance is based on a first resistor network resistance between the first amplified signal and the common mode signal, and the second resistance is based on a second resistor network resistance between the second amplified signal and the common mode signal.

8. The apparatus of claim 7, wherein the switching network comprises:
    a first switching element to selectively couple the common mode signal to a first node in the resistor network when the first amplitude is higher than the second amplitude, wherein the first resistance is between the first node and the first amplified signal and is greater than the second resistance between the first node and the second amplified signal; and
    a second switching element to selectively couple the common mode signal to a second node in the resistor network when the second amplitude is higher than the first amplitude, wherein a third resistance between the second node and the first amplified signal is less than a fourth resistance between the second node and the second amplified signal.

9. The apparatus of claim 5, wherein a ratio of the first resistance to the second resistance is approximately 4:1.

10. The apparatus of claim 1, wherein the first pulse width increases to 100% or decreases to 0% when the second amplitude is greater than the first amplitude.

11. The apparatus of claim 1, wherein the reference signal is a half-swing modulation signal.

12. The apparatus of claim 1, wherein the first and second pulse widths are between 5% and 15% or between 85% and 95% when the first and second analog signals are idle.

13. The apparatus of claim 1, wherein the a ratio of the first resistance to the second resistance is between 1000 to 1 and 1 to 1 when the first amplitude is larger than the second amplitude.

14. The apparatus of claim 1, wherein determining whether the first or second amplitude is higher comprises comparing the first amplified signal to the second amplified signal.

15. A method comprising:
  integrating an input signal to generate a first analog signal and a second analog signal;
  comparing a first amplitude based on the first analog signal to a second amplitude based on the second analog signal;
  applying a first resistance between a reference node and a first output node that receives a first amplified signal;
  applying a second resistance between the reference node and a second output node that receives a second amplified signal, wherein the first resistance is substantially equal to an upper resistance and the second resistance is substantially equal to a lower resistance when the first amplitude is higher than the second amplitude and wherein the second resistance is substantially equal to the upper resistance and the first resistance is substantially equal to the lower resistance when the second amplitude is higher than the first amplitude;
  generating a first PWM signal having a first pulse width based on the first amplified signal; and
  generating a second PWM signal having a second pulse width based on the second amplified signal.

16. The method of claim 15, wherein generating the first and second PWM signals comprises comparing the first and second analog signals to a half-swing modulation signal.

17. The method of claim 16, wherein the first amplified signal decreases below the half-swing modulation signal when the second amplitude is higher than the first amplitude.

18. The method of claim 15, wherein the second pulse width increases to 100% or decreases to 0% when the first amplitude is higher than the second amplitude.

19. The method of claim 15, wherein the first and second pulse widths are between 5% and 15% or between 85% and 95% when the input signal is idle.

20. An apparatus comprising:
  an integrator having differential input terminals and differential output terminals, wherein the integrator includes a reference changer, and wherein the reference changer includes:
    a resistor network that is coupled between the differential output terminals of the integrator;
    a comparator that is coupled to the differential output terminals of the integrator; and
    a transistor network that is coupled to and controlled by the comparator and that is coupled to the resistor network, wherein the transistor network adjusts the resistance of the resistor network in response to the comparator; and
  a PWM signal generator that is coupled to the differential output terminals of the integrator.

21. The apparatus of claim 20, wherein the integrator further comprises a common mode controller that is coupled between the differential input terminals and the differential output terminals of the integrator.

22. The apparatus of claim 21, wherein the transistor network further comprises a first transistor network and a second transistor network that are coupled together at a common mode input.

23. The apparatus of claim 22, wherein the comparator further comprises first and second output terminals, and
  wherein the first transistor networks further comprises:
    a first MOS transistor that is coupled between the resistor network and the common mode input and that is coupled to the first output terminal of the comparator at its gate; and
    a second MOS transistor that is coupled between the resistor network and the common mode input and that is coupled to the second output terminal of the comparator at its gate; and
  wherein the second transistor networks further comprises:
    a third MOS transistor that is coupled between the resistor network and the common mode input and that is coupled to the first output terminal of the comparator at its gate; and
    a fourth MOS transistor that is coupled between the resistor network and the common mode input and that is coupled to the second output terminal of the comparator at its gate.

24. The apparatus of claim 23, wherein the integrator further comprises a first integrator, and wherein the apparatus further comprises a second integrator having differential input terminals and differential output terminals, wherein the differential input terminals of the first integrator are coupled to the differential output terminals of the second integrator.

25. The apparatus of claim 24, wherein the comparator further comprises a first comparator, and wherein the PWM signal generator further comprises:
  a second comparator that is coupled to a first output terminal from the differential output terminals of the first integrator and that receives a reference voltage; and
  a third comparator that is coupled to a second output terminal from the differential output terminals of the first integrator and that receives the reference voltage.

26. The apparatus of claim 25, wherein the apparatus further comprises:
  a gate driver circuit that is coupled the second and third comparators; and
  an H-bridge that is coupled to the gate driver circuit.

* * * * *